(12) United States Patent
Bonilla et al.

(10) Patent No.: US 9,034,664 B2
(45) Date of Patent: May 19, 2015

(54) METHOD TO RESOLVE HOLLOW METAL DEFECTS IN INTERCONNECTS

(75) Inventors: Griselda Bonilla, Fishkill, NY (US); Junjing Bao, Fishkill, NY (US); Samuel S. Choi, Beacon, NY (US); Ronald G. Filippi, Wappingers Falls, NY (US); Naftali E. Lustig, Croton-on-Hudson, NY (US); Andrew H. Simon, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 13/472,555

(22) Filed: May 16, 2012

(65) Prior Publication Data

US 2013/0307151 A1    Nov. 21, 2013

(51) Int. Cl.

| H01L 21/00 | (2006.01) |
|---|---|
| H01L 21/4763 | (2006.01) |
| H01L 21/44 | (2006.01) |
| H01L 21/768 | (2006.01) |
| H01L 23/528 | (2006.01) |
| H01L 23/532 | (2006.01) |

(52) U.S. Cl.
CPC ........ *H01L 21/76849* (2013.01); *H01L 23/5283* (2013.01); *H01L 23/53238* (2013.01); *H01L 21/76832* (2013.01); *H01L 21/76834* (2013.01)

(58) Field of Classification Search
CPC ............... H01L 21/485; H01L 21/768; H01L 21/76838; H01L 21/76849; H01L 21/7685; H01L 21/76852; H01L 21/76865; H01L 21/76883

USPC ............ 438/4, 622, 618, 625, 629, 642, 652, 438/666

See application file for complete search history.

(56) References Cited

U.S. PATENT DOCUMENTS

| 5,585,673 | A | * | 12/1996 | Joshi et al. ................... 257/751 |
|---|---|---|---|---|
| 5,969,425 | A | * | 10/1999 | Chen et al. .................... 257/774 |
| 6,046,104 | A | * | 4/2000 | Kepler ........................... 438/637 |
| 6,080,660 | A | * | 6/2000 | Wang et al. .................. 438/637 |
| 6,232,223 | B1 | * | 5/2001 | Tran et al. .................... 438/637 |
| 6,417,566 | B1 | | 7/2002 | Wang et al. |
| 6,841,466 | B1 | | 1/2005 | Yu et al. |
| 6,960,529 | B1 | * | 11/2005 | Nelson et al. ................ 438/696 |
| 6,977,437 | B2 | | 12/2005 | Griffin, Jr. et al. |
| 7,064,064 | B2 | * | 6/2006 | Chen et al. ................... 438/672 |
| 7,187,085 | B2 | | 3/2007 | Clevenger et al. |

(Continued)

OTHER PUBLICATIONS

A. Farcy et al., "Optimization of Signal Propagation Performances in Interconnects of the 45 nm Node by Exhaustive Analysis of the Technological Parameters Impact," Proceedings of the IEEE 2005 International Interconnect Technology Conference, pp. 74-76.

(Continued)

*Primary Examiner* — David Zarneke
(74) *Attorney, Agent, or Firm* — Catherine Ivers

(57) ABSTRACT

A method of repairing hollow metal void defects in interconnects and resulting structures. After polishing interconnects, hollow metal void defects become visible. The locations of the defects are largely predictable. A repair method patterns a mask material to have openings over the interconnects (and, sometimes, the adjacent dielectric layer) where defects are likely to appear. A local metal cap is formed in the mask openings to repair the defect. A dielectric cap covers the local metal cap and any recesses formed in the adjacent dielectric layer.

8 Claims, 6 Drawing Sheets

(56) References Cited

U.S. PATENT DOCUMENTS

| | | | |
|---|---|---|---|
| 7,304,388 B2 * | 12/2007 | Dubin et al. | 257/762 |
| 7,317,253 B2 * | 1/2008 | Nogami | 257/758 |
| 7,473,632 B2 * | 1/2009 | Ueda | 438/622 |
| 7,494,916 B2 * | 2/2009 | Hsu et al. | 438/622 |
| 7,642,652 B2 | 1/2010 | Saito et al. | |
| 7,732,314 B1 * | 6/2010 | Danek et al. | 438/584 |
| 7,732,924 B2 * | 6/2010 | Chanda et al. | 257/761 |
| 7,745,282 B2 * | 6/2010 | Yang et al. | 438/250 |
| 7,745,324 B1 * | 6/2010 | Yang et al. | 438/618 |
| 7,749,891 B2 * | 7/2010 | Ueda | 438/622 |
| 7,759,241 B2 | 7/2010 | Budrevich et al. | |
| 7,800,228 B2 * | 9/2010 | Yang et al. | 257/758 |
| 7,867,895 B2 | 1/2011 | Yang et al. | |
| 7,956,439 B2 * | 6/2011 | Yu et al. | 257/522 |
| 7,960,274 B2 * | 6/2011 | Yang et al. | 438/618 |
| 8,558,384 B2 * | 10/2013 | Hsu et al. | 257/758 |
| 2004/0113279 A1 * | 6/2004 | Chen et al. | 257/774 |
| 2005/0064702 A1 | 3/2005 | Wang et al. | |
| 2005/0082089 A1 * | 4/2005 | Grunow et al. | 174/266 |
| 2006/0076641 A1 * | 4/2006 | Cho et al. | 257/528 |
| 2006/0088975 A1 * | 4/2006 | Ueda | 438/421 |
| 2006/0194427 A1 * | 8/2006 | Wu et al. | 438/624 |
| 2007/0052101 A1 * | 3/2007 | Usami | 257/758 |
| 2007/0111522 A1 * | 5/2007 | Lim et al. | 438/682 |
| 2007/0267751 A1 * | 11/2007 | Yang et al. | 257/758 |
| 2008/0054466 A1 * | 3/2008 | Nasu et al. | 257/751 |
| 2009/0065946 A1 * | 3/2009 | Kojima | 257/773 |
| 2009/0302475 A1 | 12/2009 | Korogi et al. | |
| 2010/0084766 A1 * | 4/2010 | Yang et al. | 257/763 |
| 2010/0230824 A1 | 9/2010 | Lee et al. | |
| 2011/0294291 A1 * | 12/2011 | Matsui et al. | 438/672 |
| 2012/0313221 A1 * | 12/2012 | Himeno | 257/618 |
| 2013/0320544 A1 * | 12/2013 | Lin et al. | 257/758 |

OTHER PUBLICATIONS

M. Yan et al., The Effect of Intermetallic Bonding on Blocking Electromigration Induced Interfacial Diffusion in Cu Dual Damascene Interconnects, Proceedings of the International Symposium Advanced Packaging Materials: Processes, Properties and Interfaces, 2005. Interconnect Technology Conference, pp. 153-155.

L. Zhang et al., "Grain Structure Effect on EM of Cu Interconnects with CoWP Capping—A Statistical Model," 2011 IEEE International Interconnect Technology Conference and 2011 Materials for Advanced Metallization (IITC/MAM), pp. 1-3.

E. Zschech et al., "Geometry and Microstructure Effect on EM-Induced Copper Interconnect Degradation," IEEE Transactions on Device and Materials Reliability, vol. 9, No. 1, Mar. 2009, pp. 20-30.

* cited by examiner

METHOD TO RESOLVE HOLLOW METAL DEFECTS IN INTERCONNECTS

FIELD OF THE INVENTION

The present invention generally relates to interconnect structures of microelectronic devices. In particular, the invention relates to methods of locally repairing a defect in an interconnect and the resulting structure.

BACKGROUND AND RELATED ART

Hollow metal is a type of defect found in metal interconnects of microelectronic devices. Hollow metal refers to voids at the surface of the metal line. The voids are detected after polishing the metal. Accordingly, hollow metal voids are different from voids formed by electromigration or stress migration because an interconnect having hollow metal has not experienced electric current or substantial heat cycles, respectively.

Void defects such as hollow metal are detrimental to both device performance, leading to electrical opens and reliability degradation, and manufacturability. Therefore, it is desirable to repair the defects.

SUMMARY

The general principal of the present invention is a method of repairing interconnects having a hollow metal void defect by a formation of a local metal cap.

In one embodiment, the method of repairing an interconnect includes forming a mask material over an interconnect post chemical mechanical polish (CMP), and opening the mask over a first portion of an interconnect and over a dielectric layer adjacent the first portion of the interconnect thereby forming a recess in the dielectric layer. The method continues by forming a local metal cap on the first portion of the interconnect and then forming a dielectric cap over the entire surface of the interconnect and adjacent dielectric layer.

Another embodiment provides a structure including an interconnect having a first portion, the first portion having a local metal cap. The structure also includes a dielectric layer adjacent the interconnect. The dielectric layer has a recess abutting the first portion of the interconnect.

In a further embodiment of the invention provides a structure including an interconnect having a first portion and a second portion, wherein the first portion has a local metal and the second portion lacks a local metal.

BRIEF DESCRIPTION OF THE DRAWINGS

Other objects, aspects and advantages of the invention will become obvious in combination with the description of accompanying drawings, wherein the same number represents the same or similar parts in all figures.

DETAILED DESCRIPTION

Figure 1A:
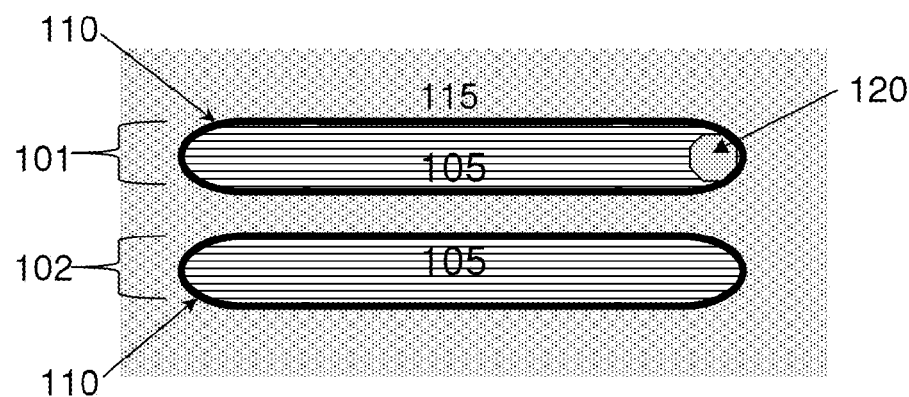
FIG. 1A is a top down view of two interconnects, one of which has a hollow metal void defect.
Figure 1B:
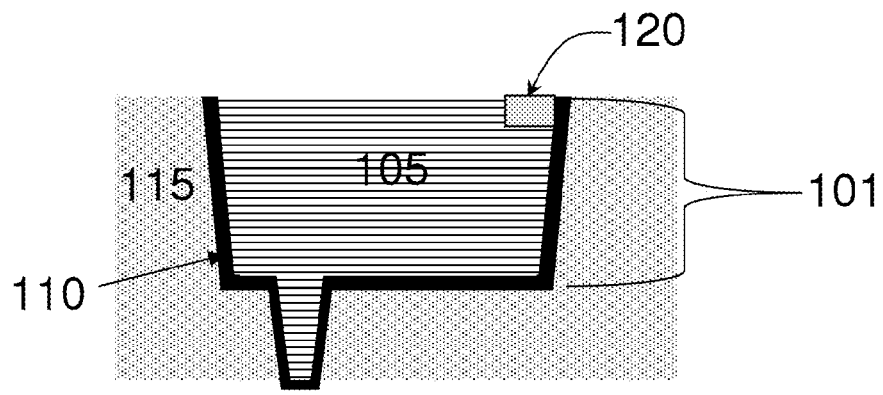
FIG. 1B illustrates a cross section through a first interconnect having a hollow metal defect.
Figure 1C:
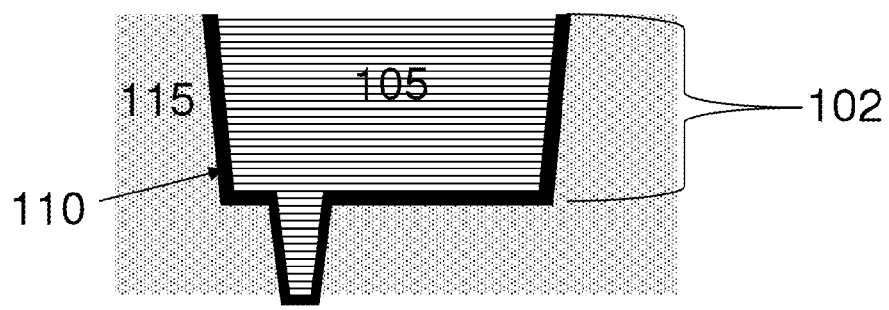
FIG. 1C illustrates a cross section through a second interconnect lacking a hollow metal defect.

A hollow metal defect is described in conjunction with FIGS. 1A-C. A method to repair a hollow metal defect in an embodiment of the present invention includes patterning and etching a mask to form a first portion of the interconnect not covered by mask, forming a local metal cap to repair the defect, and forming a dielectric cap. The method is described in conjunction with FIGS. 2-5. In another embodiment of the invention, a structure having a locally repaired defect is described in conjunction with FIGS. 6A-C. A detailed description of the invention is made in combination with the following embodiments.

Referring to FIG. 1A a top down view of a first interconnect 101 and second interconnect 102 embedded in a dielectric layer 115 is illustrated. The interconnects comprise a bulk conductor 105 and a liner 110. The first interconnect 101 has a hollow metal defect 120. FIG. 1B is a cross-section of an embodiment of the first interconnect 101. FIG. 1C is a cross-section of an embodiment of the second interconnect 102.

In FIGS. 1A-C, the interconnects 101/102 are metal lines. The metal lines may be part of a dual damascene structure as depicted in FIGS. 1B and 1C, or the interconnects 101/102 may be part of a single damascenes structure. In other embodiments, the interconnects may be single-damascene. Further embodiments may include single damascene vias, rather than metal lines.

Still referring to FIGS. 1A and C, the interconnects comprise a liner 110 which may be one or more layers which individually or in combination serve one or more of the following functions: adhesion promotion, and diffusion barrier. In a preferred embodiment, the liner 110 includes a TaN layer and Ta layer. In addition, the interconnects comprise a bulk conductor 105 which may be one or more layers. In a preferred embodiment, the bulk conductor includes copper and alloys such as copper aluminum and manganese.

The interconnects of FIGS. 1A-C are adjacent dielectric layer 115. The dielectric layer can be a single layer or, more preferably, is a composite of several layers including adhesion layers or etch stop layers. For example, but not limiting the disclosure, the dielectric layer 115 can include a silicon dioxide layer and a carbon containing silicon oxide layer; the dielectric layer 115 can include several layers having different carbon contents; the dielectric layer 115 can include a nitrogen containing layer; the dielectric layer 115 can include a porous layer; the dielectric layer 115 can includes a spin on glass, e.g. SiLK. Preferably, the dielectric layer has a dielectric constant less than or equal to four. Preferably, the dielectric layer 115 is substantially co-planar with the interconnects 101/102.

Finally, FIGS. 1A and B show a hollow metal void defect 120. Hollow metal defects are missing portions (voids) of the bulk conductor 105. In the figures, the hollow metal void 120 is shown at the end portion of the interconnect, a location where they are usually found. Typically, hollow metal defects 120 are found in minimally dimensioned structures, for example structures having a width less than 70 nm. Hollow metal voids 120 are also commonly found in via chain links A via chain link is a series of short interconnects with vias located at opposite line ends and electrically connected by an underneath metal line. The short lines are formed in a dense array to form millions of via links. Referring to FIG. 1B, the hollow metal void 120 is illustrated in cross section.

Figure 2:
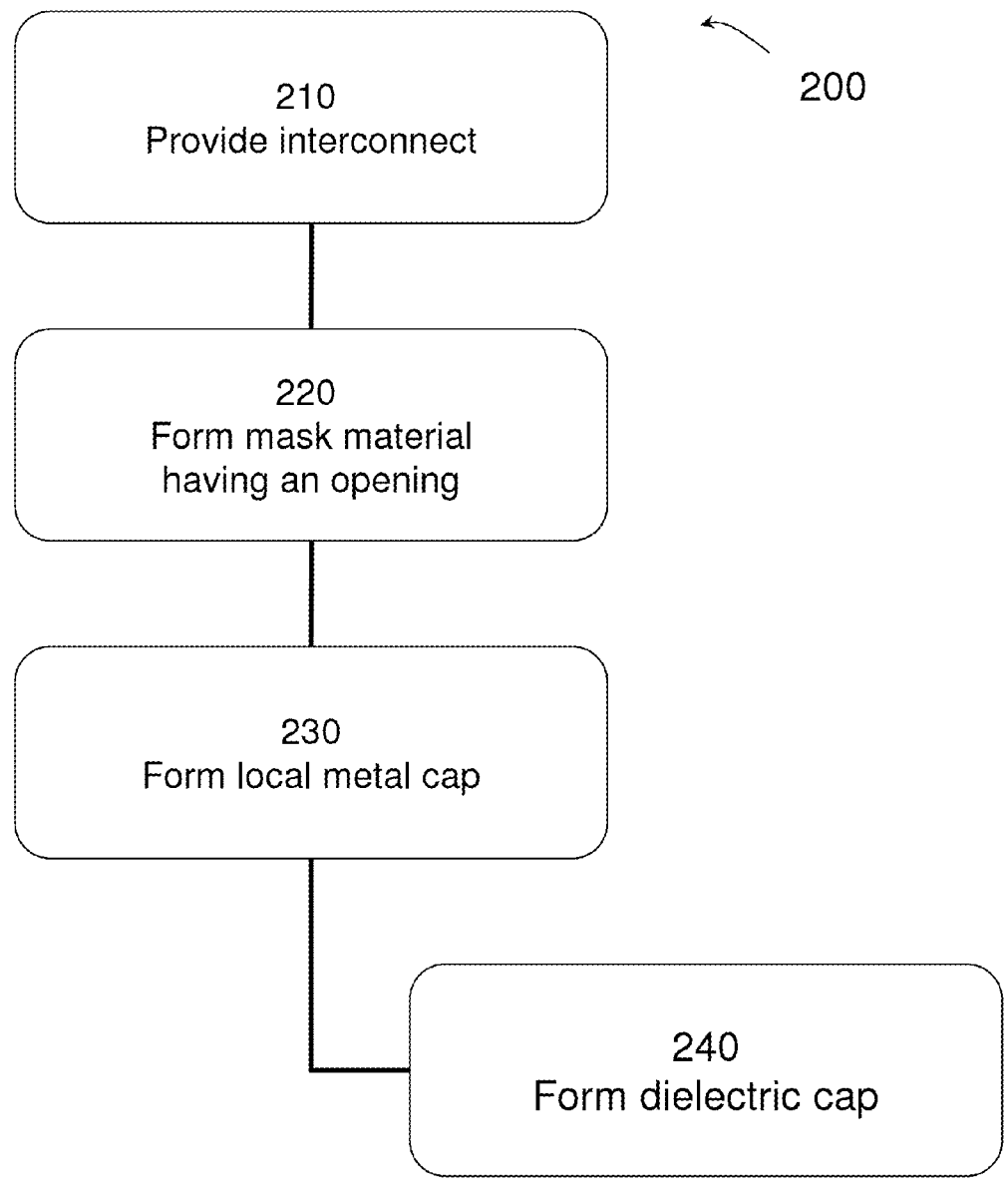
FIG. 2 is a flow chart of a method to repair hollow metal defects according to an embodiment of the present invention.

FIG. 2 is a flow chart 200 of an embodiment of a method to repair hollow metal defects. The starting point 210 is providing interconnects after the CMP module, presumably at least one of the interconnects has a hollow metal defect. A masking step 220 covers all the interconnects except for openings made at location susceptible to hollow metal. A local metal cap step 230 forms a metal cap on the interconnects in the openings of the mask. A dielectric cap 240 step covers the mask material and the local metal cap. The steps are discussed in more detail below.

Figure 3A:
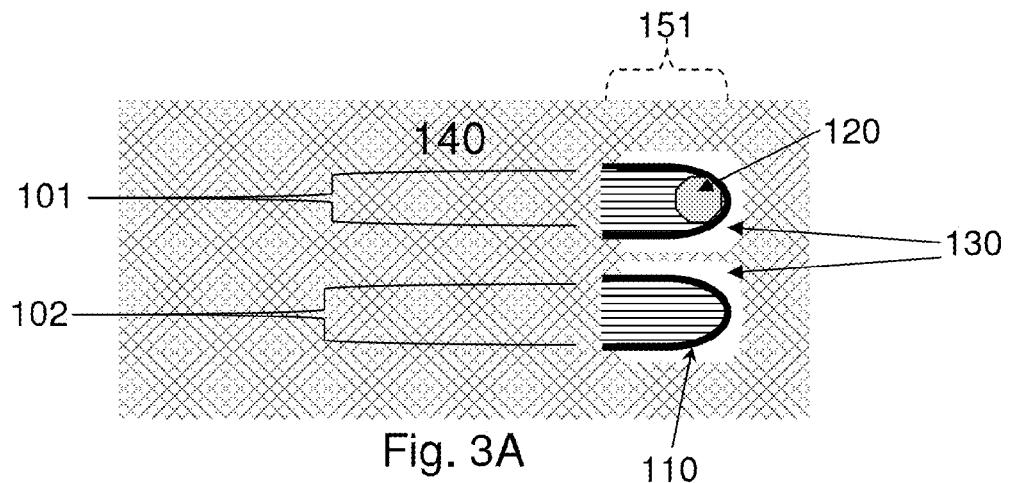
FIG. 3A is a top down view of two interconnects after the masking step creates a first portion of the interconnects uncovered by the mask material according to an embodiment of the present invention.
Figure 3B:
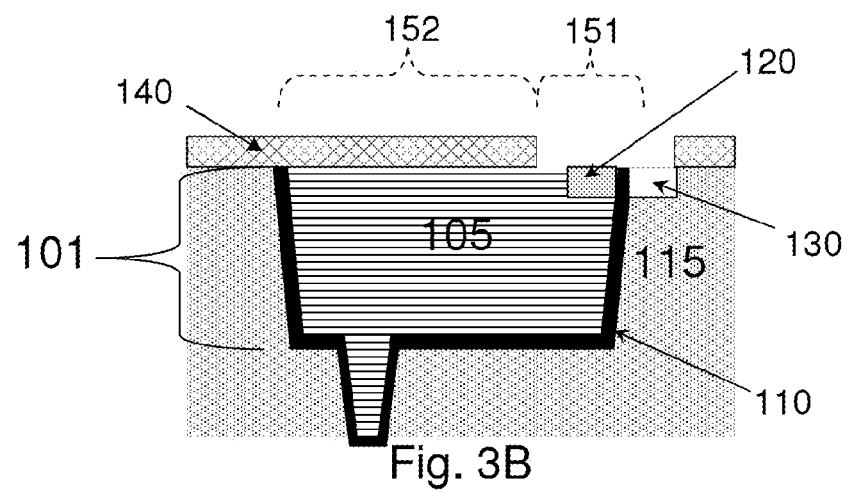
FIG. 3B illustrates a cross section through a first interconnect having a hollow metal defect of FIG. 3A.
Figure 3C:
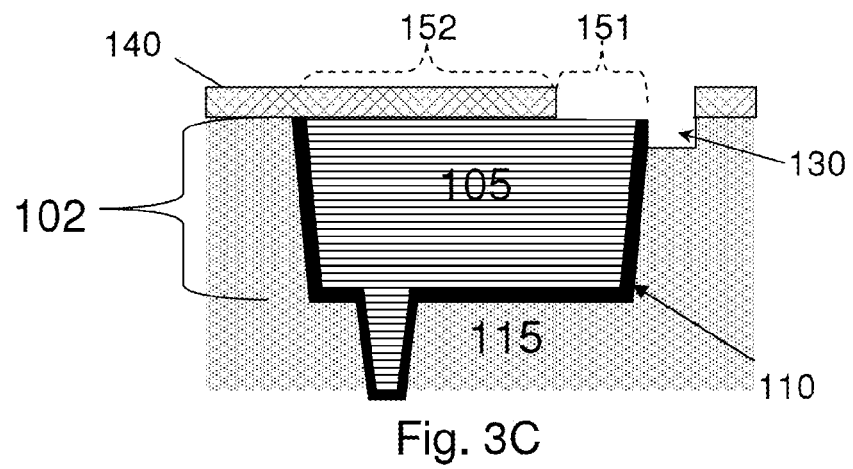
FIG. 3C illustrates a cross section through a second interconnect lacking a hollow metal defect of FIG. 3A.

FIGS. 3A-C describe a first step of an embodiment to repair the hollow metal defect void 120 of FIGS. 1A-C. In FIGS. 3A-C a mask 140 if formed above the interconnects 101/102 and dielectric layer 115. The mask 140 material is patterned and etched to expose a first portion 151 of the interconnects 101 and 102. Due to overlay tolerances, patterning and etching the mask 140 also etches a portion of the dielectric layer 115 adjacent the first portion 151 of the interconnects 101/102 thereby forming a recess 130 in the dielectric layer 115. The mask 140 material is preferably a dielectric layer containing nitrogen and or carbon. The mask 140 is from about 5 nm thick to about 100 nm and ranges there between. The etch is preferably a non-oxygen containing reactive ion etch chemistry, such as a fluorocarbon and inert element. However, any etch which does not appreciably etch the interconnects 101/102 is acceptable.

The first potions 151 of the interconnects 101/102 are the areas which are not covered by mask 140 material. Areas of the interconnects which are covered by the mask 140 material are referred to as second portions 152. In FIGS. 3A-3C, the first portions 151 for both the first 101 and second 102 interconnects are the right-hand side end portions of the interconnects, however, other configurations are also possible. For example, an individual interconnect can have multiple first portions 151, meaning, interconnect 101 could also have an area not covered by mask 140 material on the left-hand side end portion, as well. In addition, all interconnects do not have to have a first portion 151, meaning some interconnects could be completely covered by the mask 140 material. Numerous other configurations are also possible, including first portions at corners, intersections or other areas that are not end portions.

In FIGS. 3A-C, both interconnects 101 and 102 have first portions 151 and associated recesses 130 in the dielectric layer 115 adjacent the first portions 151. However, only one of the interconnects, first interconnect 101, has a hollow metal void 120 defect. Creating first portions 151 in interconnects which lack defects will occur as the photolithography reticle is designed to expose areas in which a defect likely, but not necessarily, exists.

Figure 4A:
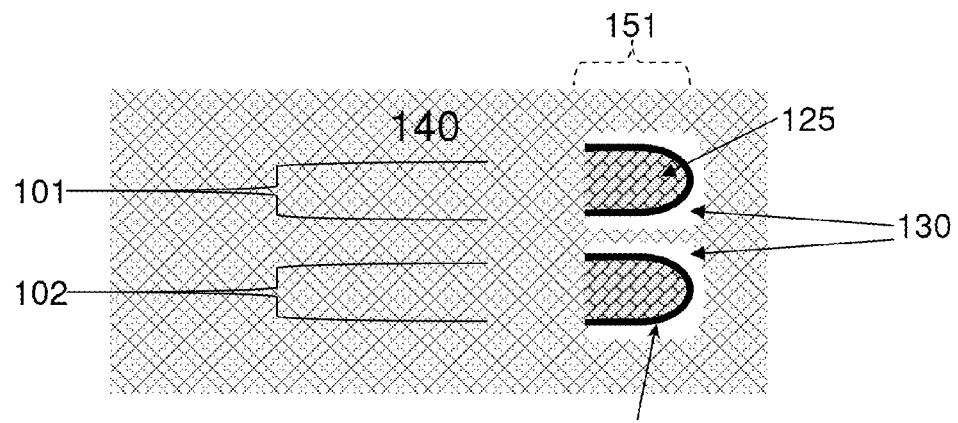
FIG. 4A is a top down view of two interconnects after the local metal cap step according to an embodiment of the present invention.
Figure 4B:
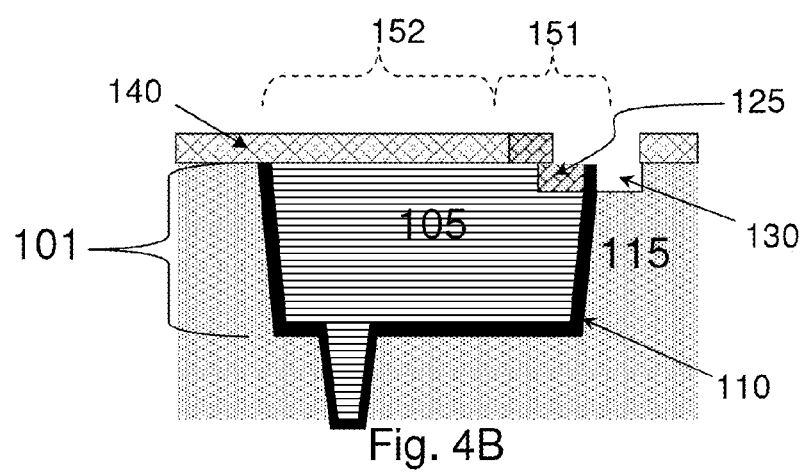
FIG. 4B illustrates a cross section through a first interconnect of FIG. 4A having a hollow metal defect filled with local metal cap.
Figure 4C:
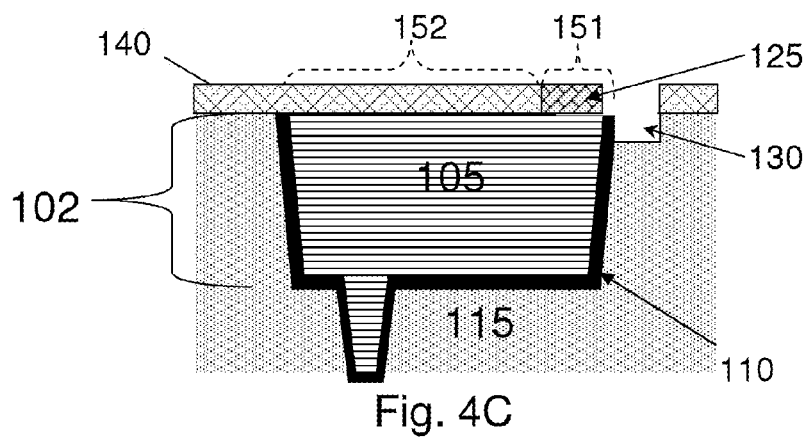
FIG. 4C illustrates a cross section through a second interconnect of FIG. 4A lacking a hollow metal defect but receiving a local metal cap.

Referring to FIGS. 4A-C, in a next step in the method of repairing a hollow metal defect, a local metal cap 125 is formed on the first portions 151 of the interconnects 101/102. Preferably, the local metal cap 125 includes cobalt, for example, but not by limitation, CoWP. The local metal cap 125 could also include ruthenium (Ru) or manganese (Mn). Also preferably, the local metal cap 125 is formed by a selective process, for example, but not by limitation, electroless deposition. Other embodiments allow for a selective chemical vapor deposition (CVD) of cobalt and/or ruthenium local metal cap 125. The local metal cap 125 is formed such that it substantially fills the hollow metal void 120, here substantially filling includes hollow metal defects 120 which are about two-thirds filled. Overfilling of the hollow metal void 120 is also acceptable. However, because the local metal cap 125 also forms on the first portions 151 in which there is no hollow metal void 120, it is preferable to keep the local metal cap 125 thinner rather than thicker. Specifically, in a preferred embodiment, the height of the local metal cap 125 does not exceed the height of the mask 140 material. If the local metal cap 125 does protrude significantly above the height of the mask 140 material, a touch up dielectric chemical mechanical polish (CMP) can be performed to planarize the local metal cap 125 with the mask 140.

Figure 5A:
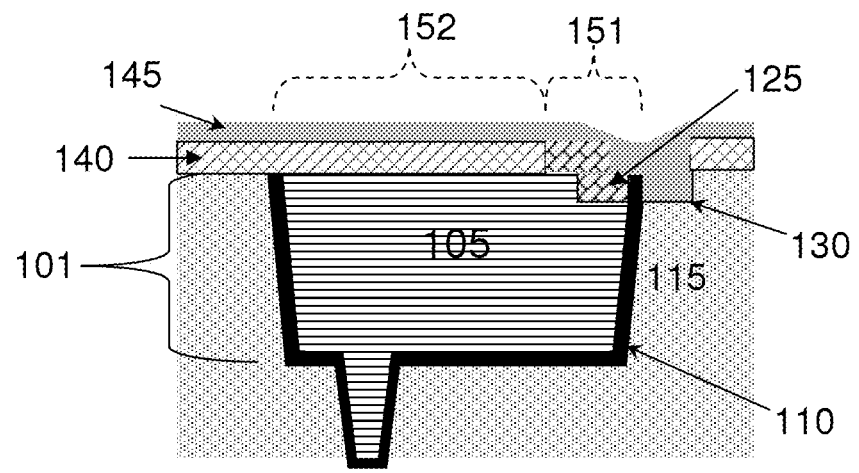
FIG. 5A illustrates a cross section through a repaired first interconnect after forming a dielectric cap according to an embodiment of the present invention.
Figure 5B:
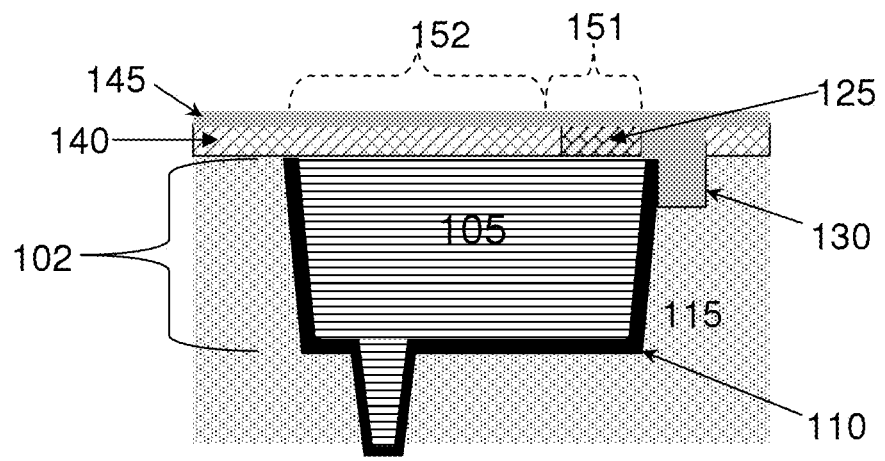
FIG. 5B illustrates a cross section through a second interconnect lacking a hollow metal defect but receiving a local metal cap and a dielectric cap according to an embodiment of the present invention.

Referring to FIGS. 5A and B, first interconnect 101 and second interconnect 102 are respectively illustrated after formation of a dielectric cap 145. Dielectric cap 145 can be the same or different material as mask 140 material. In a preferred embodiment, dielectric cap 145 comprises nitrogen, carbon or both. If needed, at this point a touch-up chemical mechanical polish (CMP) or other planarizing process can take place. Preferably, the dielectric cap 145 is conformal such that it fills recess 130 of the dielectric layer 115.

Though not pictured, further interconnect layers can be formed above the first and second interconnects. The further interconnect layers may have a first via which lands, at least partially, on the local metal cap 125, thus the first via lands a repaired interconnect rather than a void. In other areas, the further interconnect layer may have a second via which lands on a second portion of the interconnect 101/102 (where no local metal cap 125 exists).

An advantage of the method described above for repairing hollow metal-type defects, is that residual metal contamination is minimized by forming the metal cap through a mask. The resulting metal cap is localized rather than covering the entire surface of the interconnect. During selective deposition of the entire interconnect surface, often residual metal is left on top of the dielectric layer. In addition to being a contaminant that may interfere with subsequent processing steps, residual metal can lead to electrical shorts and early fails. In the present invention, depositing metal locally through a mask minimizes the formation of residual metal.

Figure 6A:
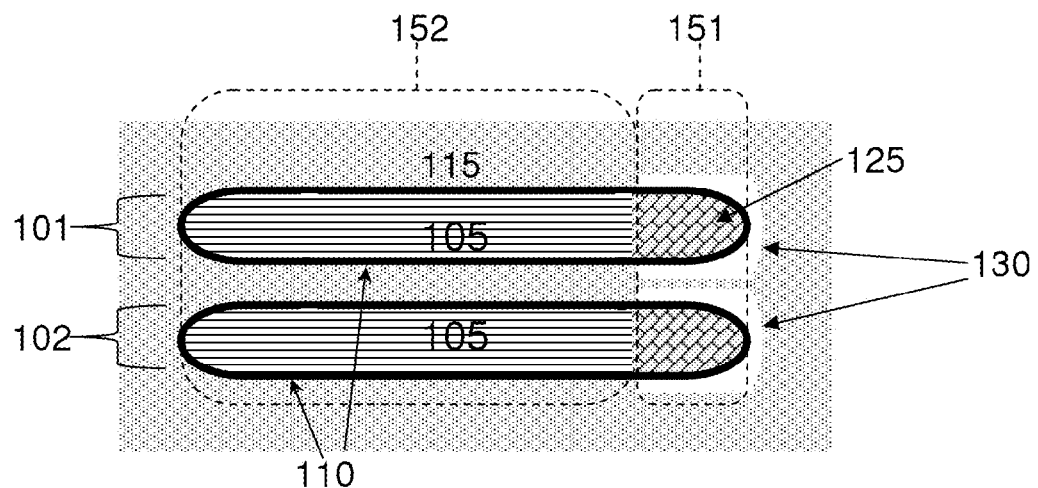
FIG. 6A is a top down view of two interconnects that received a local repair method according to an embodiment of the present invention.
Figure 6B:
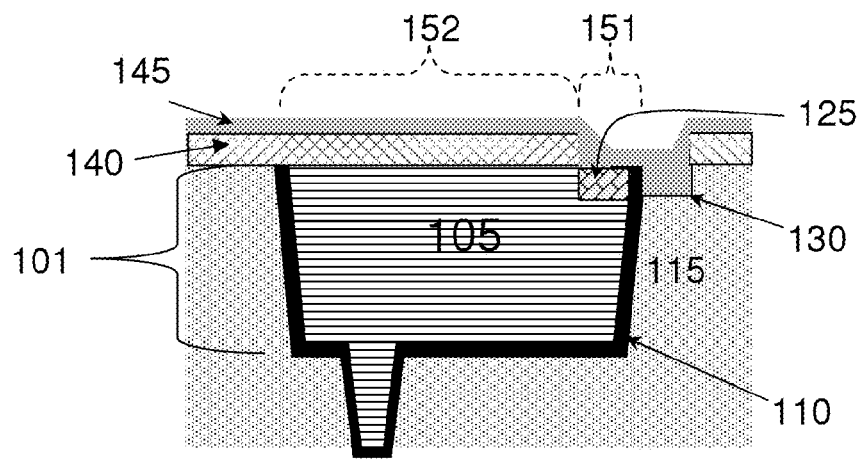
FIG. 6B illustrates a cross section through a first interconnect having a hollow metal defect repaired according to an embodiment of the present invention.
Figure 6C:
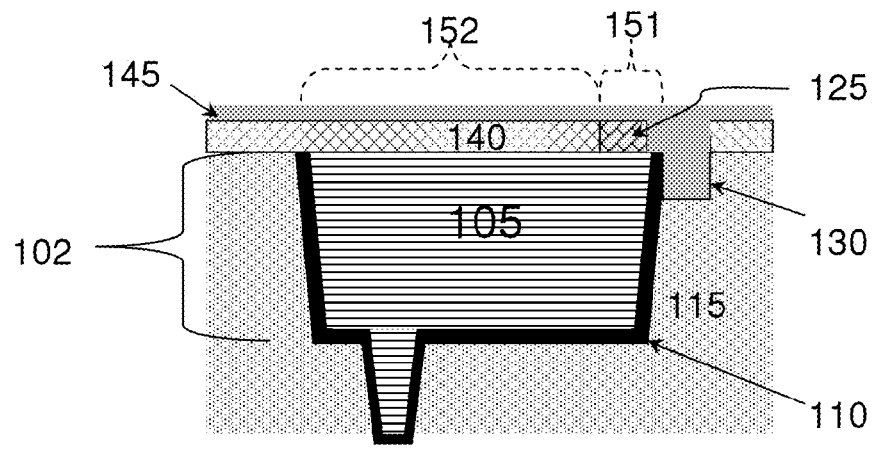
FIG. 6C illustrates a cross section through a second interconnect lacking a hollow metal defect which received a repair method according to an embodiment of the present invention.

Referring to FIGS. 6A-C, the interconnects of FIGS. 1A-C are shown after receiving a repair method according to an embodiment of the present invention. FIG. 6A is a top down view of first interconnect 101 and second interconnect 102 after repair but with mask 140 and dielectric cap 145 (shown in cross-sections 6B and 6C) removed for ease of viewing. FIG. 6A indicates the first portions 151 of the interconnects 101/102 which were not covered by mask material 140 and thus received the local metal cap 135. FIG. 6A indicates second portions 152 of the interconnects 101/102 which are covered by the mask material 140 and thus do not have a local metal cap 140.

Referring to FIG. 6B, the first interconnect 101 which had the hollow metal defect is now repaired by having a local metal cap 125 substantially fill the defect. In the first portion 151 of interconnect 101, above the local metal cap 125 is the dielectric cap 145. The dielectric cap 145 also fills the recess 130 of dielectric layer 115. In the second portion 152 of interconnect 101, there is no local metal cap 125, instead the mask 140 material is above the interconnect. In the second portion 152, the mask 140 material is between the interconnect and the dielectric cap 145.

Referring to FIG. 6C, the second interconnect 102 which lacked the hollow metal defect still received the repair method, and thus it has a local metal cap 125 on top of the interconnect 102 in first portion. In the first portion 151 of interconnect 102, above the local metal cap 125 is the dielectric cap 145. The dielectric cap 145 also fills the recess 130 of dielectric layer 115. In the second portion 152 of interconnect 102, there is no local metal cap 125, instead the mask 140 material is above the interconnect. In the second portion 152, the mask 140 material is between the interconnect and the dielectric cap 145.

An advantage of the present structure and method is that it is amenable to repairing hollow metal defects in areas that are susceptible to hollow metal defects, for example, via chains and line ends.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadcast interpretation so as to encompass all such modifications and equivalent structures and functions.

What is claimed is:

1. The method of repairing an interconnect, the method comprising:
   providing an interconnect having a void in a first portion of the interconnect
   after providing the interconnect, forming a mask over the interconnect and over a dielectric layer adjacent the interconnect;
   opening the mask over the first portion of the interconnect and over a portion of the dielectric layer adjacent the first portion of the interconnect thereby forming a recess in the portion of the dielectric layer;
   after opening the mask, forming a local metal cap on the first portion of the interconnect such that the local metal cap at least partially fills the void in the first portion of the interconnect; and
   after forming the local metal cap, forming a dielectric cap in contact with the mask layer.

2. The method of claim 1, wherein forming the local metal cap is by selective deposition.

3. The method of claim 1, wherein the local metal cap comprises cobalt.

4. The method of claim 1, wherein the dielectric cap a least partially fills the recess in the dielectric layer, and wherein the dielectric cap is above and in contact with the local metal cap.

5. The method of claim 1, wherein the dielectric cap comprises nitrogen.

6. The method of claim 1, wherein the mask and the dielectric cap are made of the same material.

7. The method of claim 1, further comprising forming a via above the interconnect wherein the via lands on the interconnect.

8. The method of claim 7, wherein the via at least partially lands on the local metal cap.

* * * * *